(12) United States Patent
Tsai

(10) Patent No.: US 6,700,909 B2
(45) Date of Patent: Mar. 2, 2004

(54) LIGHT-EMITTING DEVICE DRIVING CIRCUIT

(75) Inventor: Chia-Ming Tsai, Hsinchu (TW)

(73) Assignee: Industrial Technology Research Institute (TW)

( * ) Notice: Subject to any disclaimer, the term of this patent is extended or adjusted under 35 U.S.C. 154(b) by 0 days.

(21) Appl. No.: 10/138,314

(22) Filed: May 6, 2002

(65) Prior Publication Data

US 2003/0193977 A1 Oct. 16, 2003

(30) Foreign Application Priority Data

Apr. 12, 2002 (TW) ........................................ 91107507 A

(51) Int. Cl.[7] ................................................ H01S 3/00
(52) U.S. Cl. .................. 372/38.01; 372/38.02; 372/38.1
(58) Field of Search ........................ 372/38.01, 38.02, 372/38.1

(56) References Cited

U.S. PATENT DOCUMENTS 6,037,832 A * 3/2000 Kaminishi .................. 327/538
6,097,159 A * 8/2000 Mogi et al. ................. 315/151

* cited by examiner

*Primary Examiner*—Paul Ip
*Assistant Examiner*—Leith Al-Nazer
(74) *Attorney, Agent, or Firm*—Birch, Stewart, Kolasch & Birch, LLP

(57) ABSTRACT

A light-emitting device driving circuit. The circuit uses an adaptive feedback control circuit to control the gain of a driving circuit and set the modulation current output of the driving circuit, so as to automatically adjust the differential gain stage to the optimal gain and obtain the optimal current output waveform under any operating condition, and further to eliminate overshoot and duty cycle distortion. The light-emitting device driving circuit includes a tunable gain-controlled differential amplifier; a first differential output stage and a negative feedback control circuit. The negative feedback control circuit further includes a detection circuit, a comparison circuit and a second differential output stage.

3 Claims, 7 Drawing Sheets

LIGHT-EMITTING DEVICE DRIVING CIRCUIT

BACKGROUND OF THE INVENTION

1. Field of the Invention

The present invention relates to a driving circuit, especially to a light-emitting device driving circuit with an adaptive control, which implements a negative feedback circuit to control a tunable differential circuit for automatically compensating the output response changed by different operation conditions and obtaining an optimal modulation current output waveform.

2. Description of Related Art

FIG. 1a illustrates a light-emitting device driver including two cascaded differential stages. In FIG. 1a, the circuit 10 includes a differential gain stage and a differential output stage. As shown in FIG. 1a, the differential gain stage is formed by three FETs 16, 18, 20 and two load resistors 11, 12. The differential output stage is formed by a load resistor 13, three FETs 22, 24, 26 and a laser diode 14. In the differential gain stage, the gates of FETs 18, 20 are respectively connected to the outputs PA, PB of the previous differential gain stage, the sources are connected to the drain of FET 16, and the drains A, B are connected to a positive operating voltage source $V_{DD}$ through resistors 11, 12. Also, the drain A is connected to the gate of FET 26 and the drain B is connected to the gate of FET 24. Thus, a differential output voltage $V_{DIFF}$ with the polarity opposite to the front is generated for driving the differential output stage to output a current output. The gate of FET 16 is connected to a control voltage U to control the gain output of the differential gain stage and the source of FET 16 is connected to a negative operating voltage source Vss. In the differential output stage, the drain of FET 24 is connected to the positive operating voltage source $V_{DD}$ through resistor 13. The sources of FETs 24, 26 are connected to the drain of FET 22. The drain of FET 26 is connected to the positive operating voltage source $V_{DD}$ through a laser diode 14. The source of FET 22 is connected to the negative operating voltage source Vss, the gate C is used to receive a control voltage C so as to control the desired output current $I_{LASER}$ through the laser diode 14. The light output on the laser diode is controlled by the desired output current changed by the differential output voltage $V_{DIFF}$. The curve of output current-differential voltage (I-V) is shown in FIG. 1b. In the curve CASE1, the current $I_{LASER}$ and the voltage $V_{DIFF}$ present a proportional relationship and the voltage $V_{DIFF}$ is a constant as controlled by the input gate control voltage (for example, U). However, problems arise with this circuit when the circuit must operate in a relatively low modulation current (for example, in the range of 10–20 mA), as shown in CASE2. That is, the large value of $V_{DIFF}$ supplied as the input to FEDs 24, 26 of the output stage will overdrive these devices in the presence of the low current level supplied by FET 22. As a result, the laser output will overshoot and generate duty cycle distortion.

FIG. 2a illustrates another light-emitting device driver including two cascaded differential stages. In FIG. 2a, compared to FIG. 1a, the circuit is the same as that of FIG. 1a except for the gain output control and the output modulation control. As shown in FIG. 2a, the gain output control and the output modulation control are externally connected to a same control voltage U', different from different control voltages U and C, to control gates of FETs 50 and 56 and generate a dynamic gain control for the current output waveform. As such, as shown in FIG. 2b, the operating point positioned at either CASE1 or CASE2 can adjust the $V_{DIFF}$ operating range depending on the modulation current in the range of R so as to avoid the overshoot. However, for such a dynamic gain control circuit, when the operating temperature and/or the processes are changed, the operating point (condition) is changed so as to create problems. Unfortunately, the above-mentioned circuit cannot respond to the variance flexibly. For example, a duty cycle distortion is required to obtain the optimal current output characteristics.

SUMMARY OF THE INVENTION

Accordingly, an object of the invention is to provide a light-emitting device driving circuit with an adaptive control, which implements a negative feedback circuit to control a tunable differential circuit for automatically compensating the output response changed by different operation conditions and obtaining an optimal modulation current output waveform.

The invention is a light-emitting device driving circuit, which implements a negative feedback circuit to make the differential gain stage auto-adjusted to the optimal gain and thus to obtain the optimal current output waveform at any operating condition, so as to eliminate the overshoot and duty cycle distortion. The light-emitting device driving circuit includes: a tunable gain-controlled differential amplifier; a first differential output stage and a negative feedback control circuit. The negative feedback control circuit further includes: a detection circuit, a comparison circuit and a second differential output stage. The detection circuit acquires a current gain level and output the current gain level to the second differential output stage to generate an output current. The comparison circuit compares the output current and a predetermined reference current and feeds the comparison result back to the detection circuit and the tunable differential gain stage. Thus, auto-adjustment of the gain is achieved to optimize the output waveform of the first differential output stage.

BRIEF DESCRIPTION OF THE DRAWINGS

FIG. 1b is a plot of the current-voltage (I-V) curve of FIG. 1a;

FIG. 2b is a plot of the current-voltage(I-V) curve of FIG. 2a;

DETAILED DESCRIPTION OF THE INVENTION

Figure 1A:
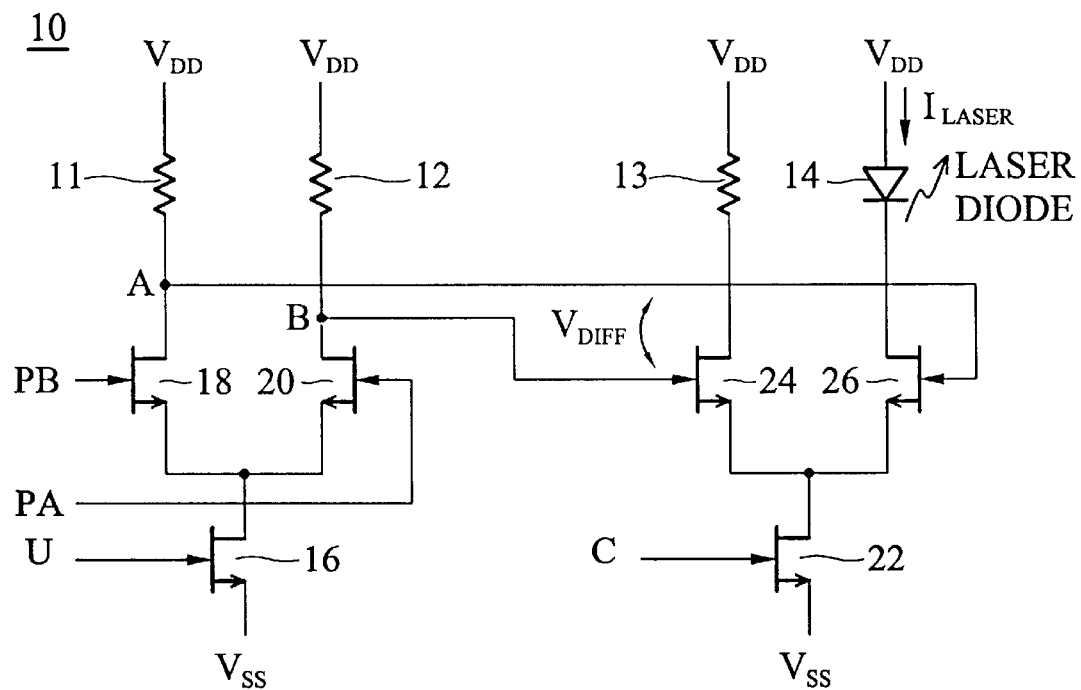
FIG. 1a illustrates a light-emitting device driver including two cascaded differential stages.
Figure 1B:
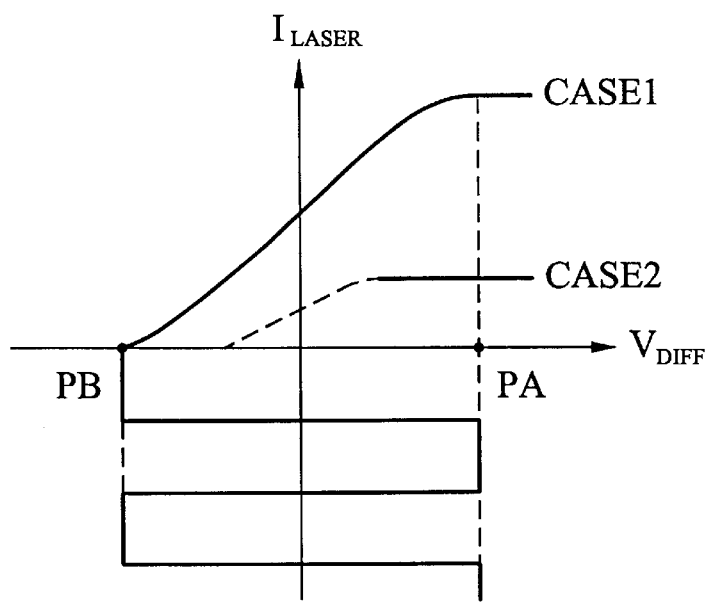
Figure 2A:
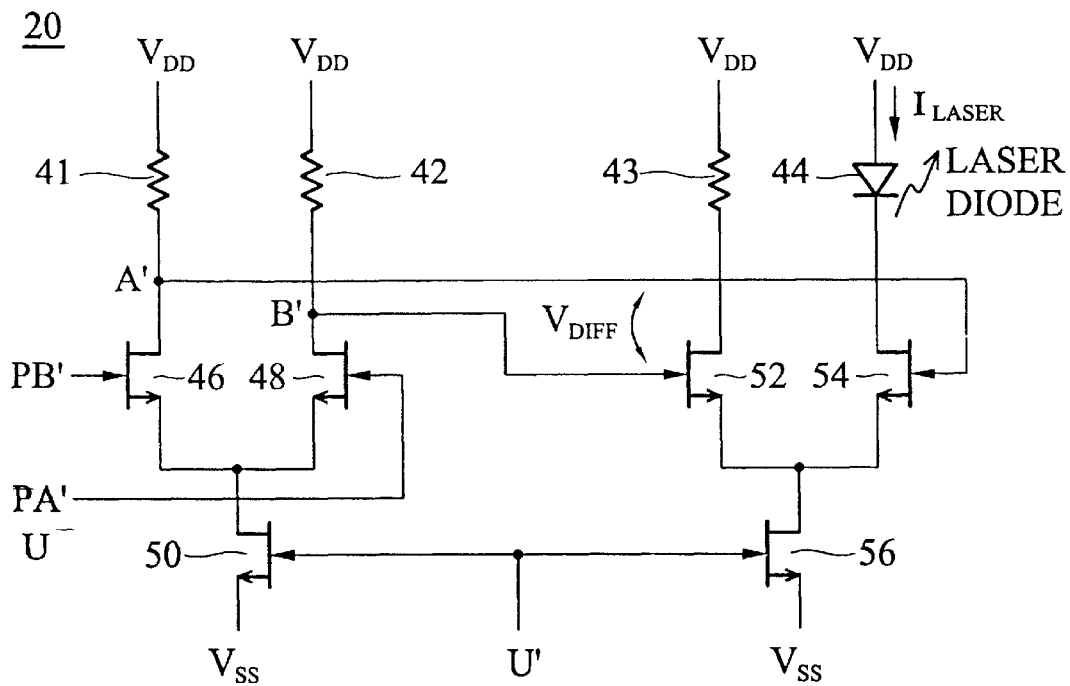
FIG. 2a illustrates another light-emitting device driver including two cascaded differential stages.
Figure 2B:
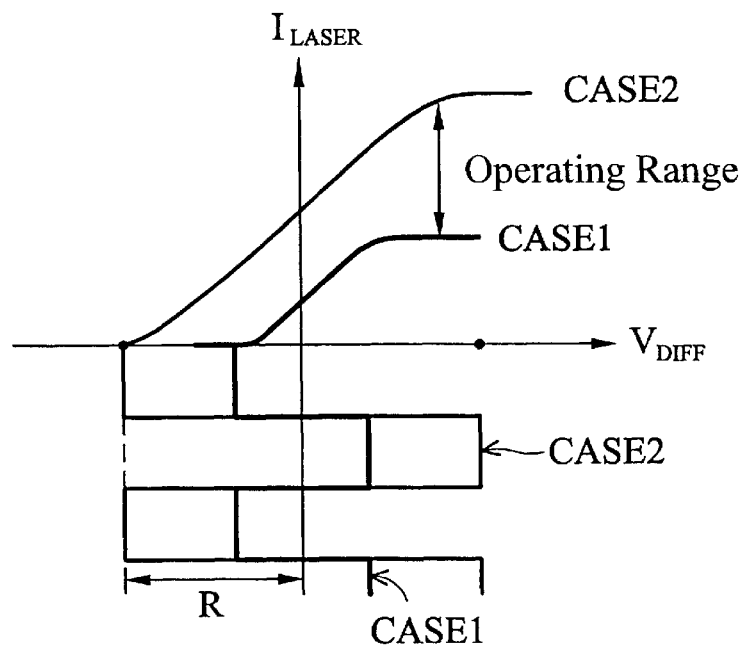

The following similar function elements are denoted by the same reference numerals.

Figure 3A:
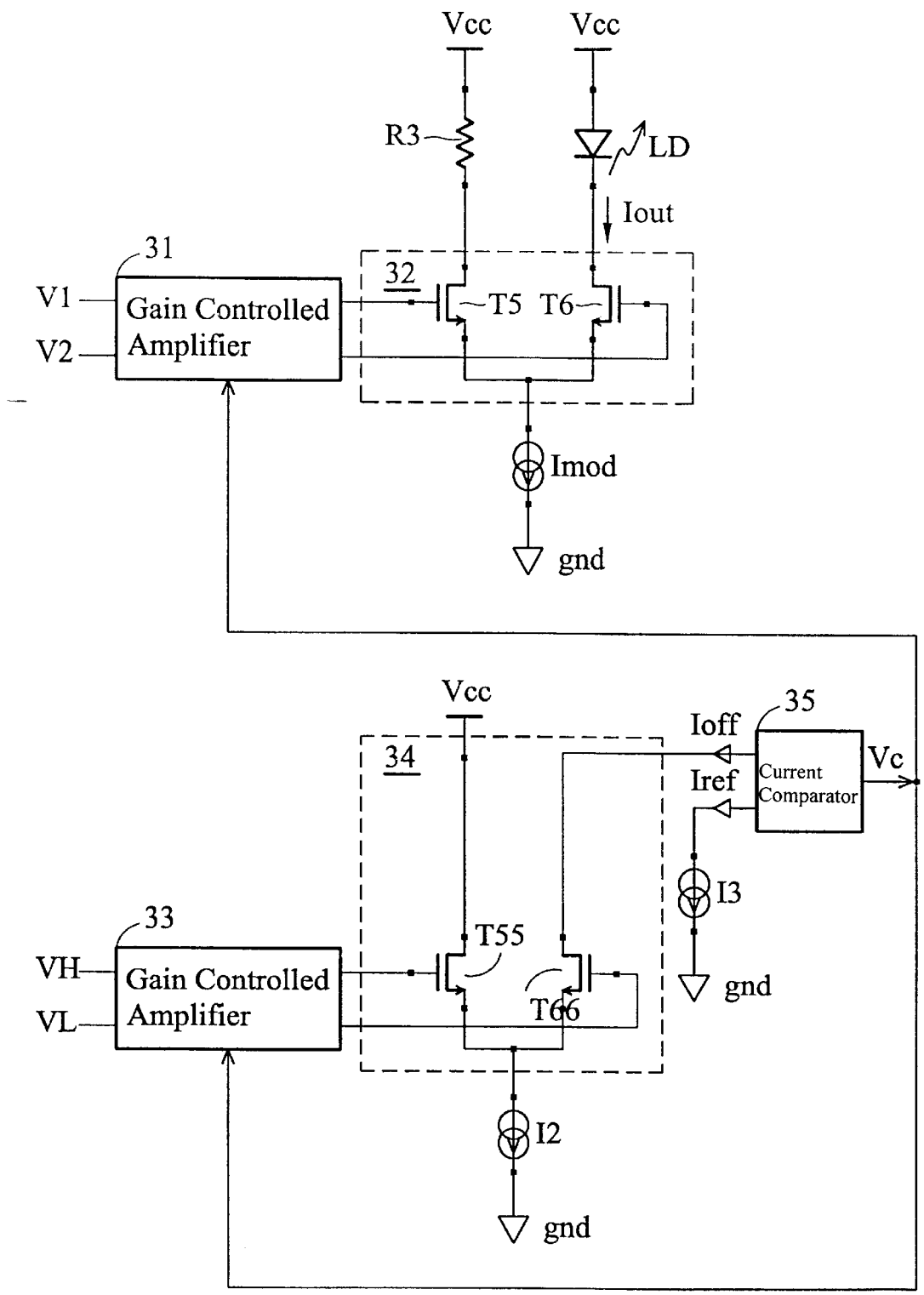
FIG. 3a is a schematic diagram of a light-emitting device driving circuit in accordance with the invention.
Figure 3B:
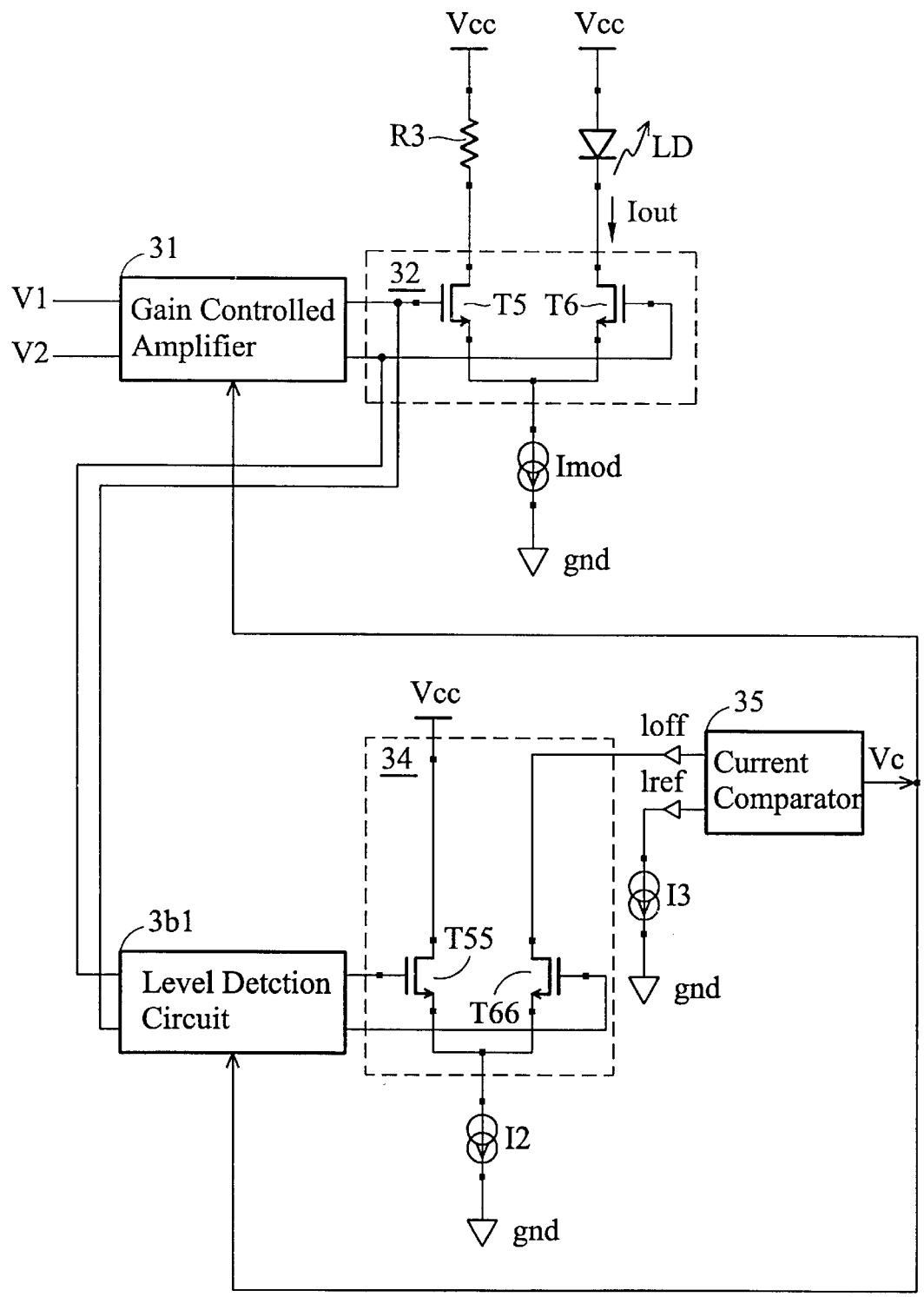
FIG. 3b is a schematic diagram of another light-emitting device driving circuit in accordance with the invention.
Figure 3C:
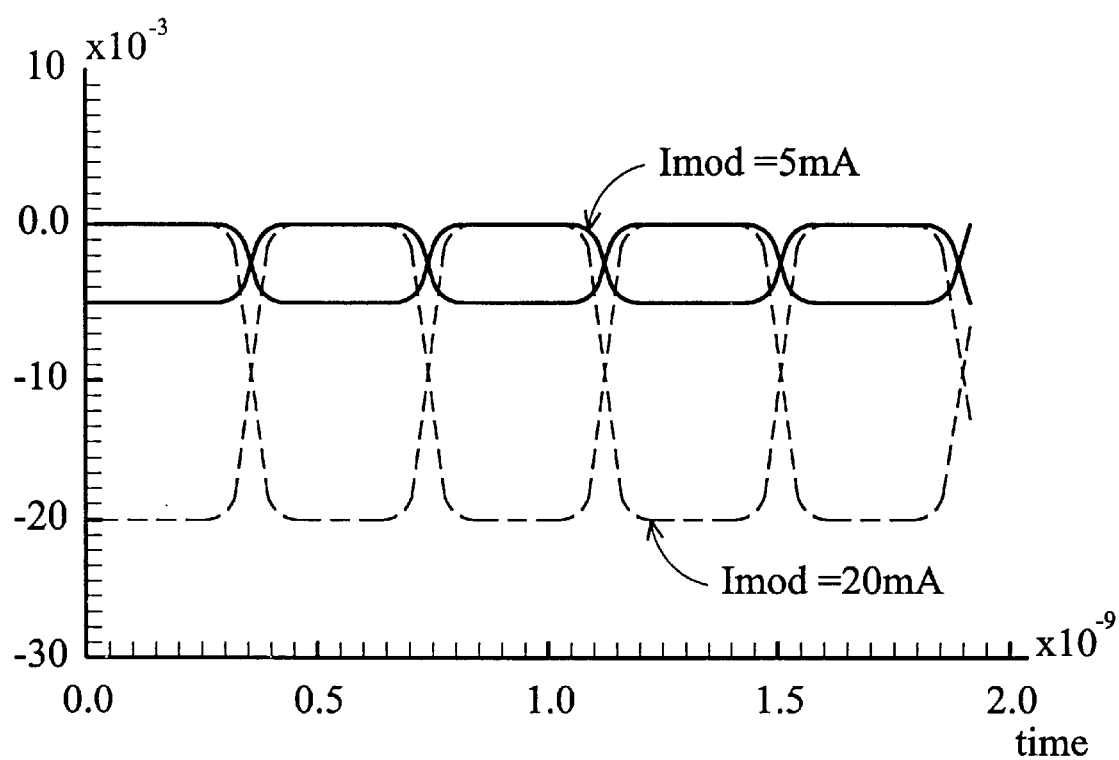
FIG. 3c is a plot of the current output response curves of FIG. 3a in accordance with the invention.

FIG. 3a illustrates a schematic diagram of a light-emitting device driving circuit in accordance with the invention. In FIG. 3a, the circuit includes: a gain-controlled differential amplifier 31; a first differential current output stage 32; a duplicate gain-controlled differential amplifier 33, a second differential current output stage 34, a current comparator 35, a grounded modulation current source Imod, a second grounded current source I2 and a grounded reference current source I3. The duplicated gain-controlled differential amplifier 33, the second differential current output stage 34, the current comparator 35, the second grounded current source I2 and the grounded reference current source I3 constitute a negative feedback control circuit. As shown in FIG. 3a, the amplifier 31a adjusts the gain by the feedback voltage Vc of the negative feedback control circuit. To generate the auto-adjusted gain ability, the duplicate amplifier 33 is the same as the amplifier 31 except for differential inputs. Differential inputs of the amplifier 31 connect the previous drain (source) followed gain-controlled differential amplifier (not shown) to generate the required differential inputs V1, V2. Differential inputs of the amplifier 33 externally connect high and low voltages VH, VL at complete saturation. Thus, the duplicate amplifier 33 can be operated in HI or LO area as shown in FIG. 3e to output a set of high and low reference voltages and simulate the output level of the amplifier 31. The invention is not limited to the use of differential inputs VH, VI and duplicate amplifier 33 to detect high and low output levels of the amplifier 31. The level detection circuit 3b1 as shown in FIG. 3b (the remaining is the same as that of FIG. 3a) is also available to detect the high and low output levels.

Again referring to FIG. 3a, when high and low saturation differential voltages VH, VL input to the duplicate amplifier 33 as a level detection circuit, one of devices T55 and T66 is turned ON and the other OFF due to the different polarities on VH and VL. The current comparator 35 compares the current Ioff and the current Iref from the grounded reference current source I3 to obtain the negative feedback voltage Vc. The negative feedback voltage Vc is fed back to the differential amplifiers 31, 33 to adjust the output gain. As such, automatic adjustment of the gain is achieved and the optimal output waveform is generated. In practice, under the operating conditions in which the second grounded current source I2 higher than the grounded modulation current source Imod by 0–30% and the third grounded current source I3 is 0.1–10% of first grounded current source Imod, the circuit automatically adjusts the output gain of the device 31 to optimize the current output waveform of the differential output stage 32 when the operating conditions, for example, temperature and layout, are changed. Two waveforms under the operating conditions of Imod=5 and 20 mA are shown in FIG. 3c. The present waveforms' overshoot is optimized and the duty cycle distortion is improved.

Figure 3D:
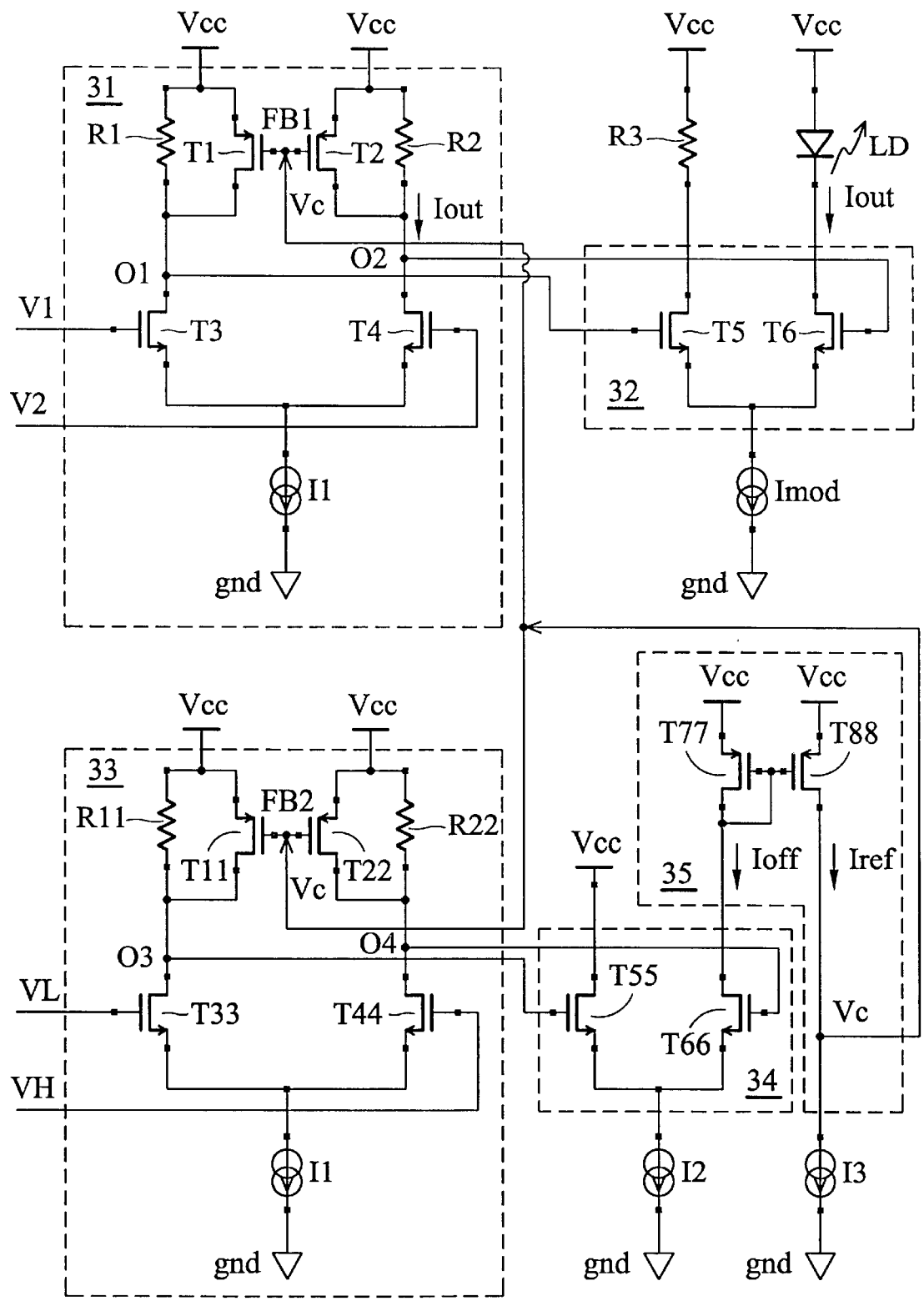
FIG. 3d illustrates an embodiment of FIG. 3a in accordance with the invention.
Figure 3E:
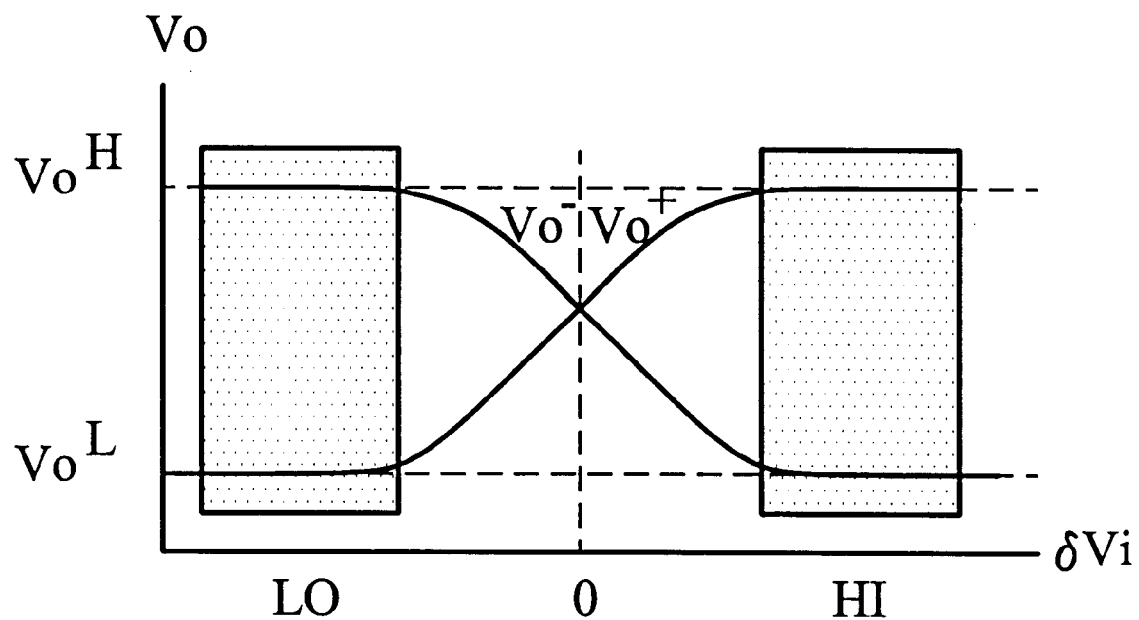
FIG. 3e is a diagram of the output-input relationship of a digital circuit in accordance with the invention.

FIG. 3d is an embodiment of FIG. 3a. In FIG. 3d, the gain-controlled differential amplifier 31 is not limited to one-stage, and may involve multiple stages being carried out, however, for clarity and description, the embodiment only shows a tunable differential gain stage. The tunable differential gain stage 31 includes a first grounded current source I1, a first pair of shunt resistor and PMOSFET (R1, T1), a second pair of shunt resitor and PMOSFET (R2, T2), a first pair of NMOSFETs (T3, T4). The duplicated circuit 33 as a level detection circuit includes a first current source I1, a third pair of shunt resistor and PMOSFET (R11, T11), a fourth pair of shunt resistor and PMOSFET (R22, T22) a third pair of NMOSFETs (T33, T44). The first differential current output stage 32 includes a second pair of NMOS-FETs (T5, T6) to operate with a grounded modulation current source Imod. Resistor R3 and laser diode LASER are the loads of the first differential current output stage 32. The second differential current output stage 34 includes a fourth pair of NMOSFETs (T55, T66) to operate with a second grounded current source I2. The current comparator 35 includes a pair of PMOSFETs (T77, T88) As shown in FIG. 3d, in the circuit 31, one end of the first pair (R1, T1) is connected to a positive operating voltage Vcc and the other end is connected to the drain of NMOSFET T3 to form a connection point as a first output terminal O1. One end of the second pair (R2, T2) is connected to the positive operating voltage Vcc and the other end is connected to the drain of NMOSFET T4 to form a connection point as a second output terminal O2. The gate of PMOSFET T1 is connected to the gate of PMOSFET T2 to form a connection point as the input of a negative feedback voltage Vc. The sources of NMOSFETs T3, T4 are connected to the non-grounded end of the first grounded current source I1 and the gates are connected to the previous stage differential voltages V1, V2 that have different polarities. In the circuit 32, the gates of NMOSFET T5, T6 are connected to the output terminals O1, O2 and the sources are connected to the non-grounded end of the grounded modulation current source Imod. The drain of NMOSFET T5 is connected to the positive operating voltage Vcc through resistor R3. The anode of the laser diode LASER is connected to the positive operating voltage Vcc and the cathode is connected to the drain of NMOSFET T6 where the output terminal of a modulation current Iout is. In the circuit 33, one end of the third pair (R11, T11) is connected to the drain of NMOSFET T33 to form a connection point as a third output terminal O3. One end of the fourth pair (R22, T22) is connected to the positive operating voltage Vcc and the other end is connected to the drain of NMOSFET T44 to form a connection pointer as a fourth output terminal O4. The gate of PMOSFET T11 is connected to the gate of PMOSFET T22 to form a connection point as the input of the negative feedback voltage Vc. The sources of NMOSFETs T33, T44 are connected to the non-grounded end of the first grounded current source I1 and the gates are respectively connected to VL and VH. Simplified, VL and VH can be the ground and the voltage Vcc. In the circuit 34, the gates of NMOSFETs T55, T66 are connected to the output terminals O3, O4 and the sources are connected to the non-grounded end of the second grounded current source I2. The drain of NMOSFET T55 is connected to the voltage Vcc. In the circuit 35, PMOSFETs T77 and T88 form a current mirrored pair. The source of PMOSFET T77 is connected to the voltage Vcc, the drain of PMOSFET T77 is connected to the drain of NMOSFET T66, and the gates of PMOSFET T77, T88 are connected to the drain of NMOSFET T66. The source of PMOSFET T88 is connected to the voltage Vcc and the drain is connected to the grounded reference current source I3 to form a connection point performing the comparison function as a feedback output of the negative feedback voltage Vc.

The input differential voltages like V1, V2, V3, and VH in FIGS. 3a and 3b are digital, as shown in FIG. 3e. That is, any signal located in the HI or LO area of FIG. 3e is selected and input as an input differential voltage so as to generate the output representing a digital voltage signal 0 (VoL) or 1 (VoH).

In the present embodiment, the negative feedback circuit was designed to control the output of the current Ioff at about 0.1–10% of the modulation current Imod. Thus, the grounded reference current I3 is set to about 0.1–10 of Imod or so, to automatically adjust the gain and obtain the optimal current output waveform. However, because the turned-off output terminal of NMOSFET T66 still has some current, switch between NMOSFET T55 and T66 is not complete. This influences the switch between NMOSFETs T5 and T6 controlled by the value of Imod. To overcome this problem, the current source's value was designed about 0–30% higher than Imod. Thus, the relationship among I2, I3 and Imod is: I2=(1+x)*Imod and I3 =Y*Imod, wherein when x ranges between 0–0.3 and Y ranges between 0–0.1, and the best optimization is achieved.

Although the present invention has been described in its preferred embodiment, it is not intended to limit the invention to the precise embodiment disclosed herein. Those who are skilled in this technology can still make various alterations and modifications without departing from the scope and spirit of this invention. Therefore, the scope of the present invention shall be defined and protected by the following claims and their equivalents.

What is claimed is:

1. A driving circuit, operating in combination with a positive operating voltage source, a first grounded current source, a second grounded current source, a grounded modulation current source and a grounded reference current source, the driving circuit comprising:

a first adjustment gain assembly pair, including a first resistor and a first PMOSFET connected in parallel with the first resistor, wherein the source of the first PMOSFET is connected to the positive operating voltage source;

a second adjustment gain assembly pair including a second resistor and a second PMOSFET connected in parallel with the second resistor, wherein the source of the second PMQSEET is connected to the positive operating voltage source and the gate of the second PMOSFET is connected to the gate of the first PMOSFET to form a connection terminal as a first input terminal of a negative feedback voltage;

a first differential gain assembly pair including a first and a second NMOSFETs, wherein the drain of the first NMOSFET is connected to the first adjustment gain assembly pair to form a connection terminal as a first output terminal, and the gate of the first NNOSFET is externally connected to receive a first voltage, the drain of the second NMOSFET is connected to the second adjustment gain assembly pair to form a connection terminal as a second output terminal, the gate of the second NMOSFET is externally connected to receive a second voltage, and the source of the second NMOSFET is connected to the source of the first NMOSFET and the first grounded current source;

a first differential output stage including a first differential output assembly pair having third and fourth NMOSEETs, wherein the drain of the third NMOSEET is connected to the positive operating voltage source through a loading resistor, the gate of the third NMOSFET is connected to the first output terminal, the drain of the fourth NMOSFET is connected to the cathode of a laser diode, the gate of the fourth NMOSFET is connected to the second output terminal, the source of the fourth NMOSFET is connected to the source of the third NMOSFET and the grounded modulation current source, the anode of the laser diode is connected to the positive operating voltage source, and the cathode of the laser diode is connected to the current output terminal of the driving circuit;

a third adjustment gain assembly pair including a third resistor and a third PMQSFET connected in parallel with the second resistor, wherein the source of the third PMOSFET is connected to the positive operating voltage source;

a fourth adjustment gain assembly pair including a fourth resistor and a fourth PMOSFET connected in parallel with the second resistor, wherein the source of the fourth PMOSEET is connected to the positive operating voltage source and the gate of the fourth PMOSFET is connected to the gate of the third PMOSFET to form a connection terminal as a second input terminal of the negative feedback voltage;

a second differential gain assembly pair including fifth and sixth NMOSFETs, wherein the drain of the fifth NMOSFET is connected to the third adjustment gain assembly pair to form a connection terminal as a third output terminal, the gate of the first NMOSFET is externally connected to receive a low input voltage, the drain of the sixth NMOSFET is connected to the fourth adjustment gain assembly pair to form a connection terminal as a fourth output terminal, the gate of the sixth NMOSFET is externally connected to receive a high input voltage, and the source of the sixth NMOSFET is connected to the source of the fifth NMOSFET and the first grounded current source;

a second differential output stage including a second differential output assembly pair having seventh and eighth NMOSFETs, wherein the drain of the seventh NMOSFET is connected to the positive operating voltage source, the gate of the seventh NMOSFET is connected to the third output terminal, the source of the eighth NMOSETET is connected to the source of the seventh NMOSFET and the second grounded current source, and the gate of the eighth NMOSEET is connected to the second output terminal; and a current comparison circuit including fifth and sixth PMOSFETs, wherein the source of the fifth PMOSFET is connected to the positive operating voltage source, the drain of the fifth PMOSFET is connected to the drain of the eighth NMOSFET to form a connection terminal as an output current terminal of the eighth NMOSFET, the source of the sixth PMOSFET is connected to the positive operating voltage source, the drain of the sixth PMOSFET is connected to the grounded reference current source to form a connection terminal as the output terminal of the negative feedback voltage, and the gate of the sixth PMOSFET is connected to the connection of the gate of the fifth PMOSFET, the drain of the fifth PMOSFET and the drain of the eighth NMOSFET.

2. A light-emitting device driving circuit, comprising:

a main driving circuit coupled to a light-emitting device, comprising:

a first tunable differential gain stage, receiving differential input signals to output differential output voltages, and having first gain adjusted according to a feedback voltage;

a first differential output stage having differential inputs coupled to the first tunable differential gain stage, and having an current output terminal coupled to the light-emitting device;

a modulation current source, coupled between the first differential output stage and ground to provide a modulation current, wherein the differential output stage drives the light-emitting device according to the modulation current and the differential output voltages; and a feedback circuit coupled to the main driving circuit, comprising:
- a second tunable differential gain stage, simulating the differential output voltages of the first differential output stage according to a high voltage and a low voltage at complete saturation, and outputting simulation differential voltages, wherein the second tunable differential gain stage has a second gain adjusted by the feedback voltage;
- a second differential output stage having differential inputs coupled to the second tunable differential gain stage, a simulation current source, coupled between the second differential output stage and ground to provide a simulation current, wherein the differential output stage outputs a comparison current according to the simulation current and the simulation differential voltages; a reference current source coupled to the second differential output stage to provide a reference current; and
- a comparison circuit coupled to the second differential output stage and the reference current source to compare the reference current and the comparison current and to produce the feedback voltage.

3. A light-emitting device driving circuit, comprising:

a main driving circuit coupled to a light-emitting device, comprising:
- a first tunable differential gain stage, receiving differential input signals to output differential output voltages and having first gain adjusted according to a feedback voltage;
- a first differential output stage having differential inputs coupled to the first tunable differential gain stage, and having a current output terminal coupled to the light-emitting device;
- a modulation current source, coupled between the first differential output stage and ground to provide a modulation current, wherein the differential output stage drives the light-emitting device according to the modulation current and the differential output voltages; and a feedback circuit coupled to the main driving circuit, comprising:
- a detection circuit coupled to the first tunable differential gain stage to detect output levels of the differential output voltages output from the first tunable differential gain stage, and outputting the output levels;
- a second differential output stage having differential inputs coupled to the detection circuit, a simulation current source, coupled between the second differential output stage and ground to provide a simulation current, wherein the second differential output stage outputs a comparison current according to the simulation current and the output levels;
- a reference current source coupled to the second differential output stage to provide a reference current; and
- a comparison circuit coupled to the second differential output stage and the reference current source to compare the reference current and the comparison current and produce the feedback voltage.

* * * * *